(12) United States Patent
Igarashi

(10) Patent No.: US 6,565,994 B2
(45) Date of Patent: May 20, 2003

(54) LIGHT EMITTING DEVICE MATERIAL COMPRISING IRIDIUM COMPLEX AND LIGHT EMITTING DEVICE USING SAME MATERIAL

(75) Inventor: Tatsuya Igarashi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 13 days.

(21) Appl. No.: 09/780,487

(22) Filed: Feb. 12, 2001

(65) Prior Publication Data

US 2001/0015432 A1 Aug. 23, 2001

(30) Foreign Application Priority Data

Feb. 10, 2000 (JP) .......................................... 2000-033561

(51) Int. Cl.⁷ ................................................ H05B 33/14
(52) U.S. Cl. ........................ 428/690; 428/917; 313/504; 313/506
(58) Field of Search ................................ 428/690, 917; 313/504, 506; 257/40, 102, 103; 252/301.16; 546/2, 10; 548/101, 108

(56) References Cited

U.S. PATENT DOCUMENTS

2002/0182441 A1 * 12/2002 Lamansky et al. .......... 428/690

OTHER PUBLICATIONS

M. Maestri et al., "Photochemistry and Luminescence of Cyclometallated Complexes", Advances in Photochemistry, vol. 17, 1992, pp. 1–68. (no month).*

N. Sutin et al., "Light Induced Electron Transfer Reactions of Metal Complexes", Pure & Applied Chemistry, vol. 52, 1980, pp. 2717–2738. (no month).*

C. W. Tang et al., Organic Electroluminescent Diodes, (Sep. 21, 1987), Appl. Phys. Lett. 51(12), pp. 913–915.

M. A. Baldo et al., Very High–Efficiency Green Organic Light–Emitting Devices Based on Electrophosphorescence, vol., 75, No. 1, (Jul. 5, 1999), Appl. Phys. Lett. pp. 4–6.

* cited by examiner

*Primary Examiner*—Marie Yamnitzky
(74) *Attorney, Agent, or Firm*—Sughrue Mion, PLLC

(57) ABSTRACT

Materials enabling light emitting devices to have various light emitting colors and reduced operation voltages, which each comprise an iridium complex having a partial structure represented by the following formula (1) or a tautomer thereof:

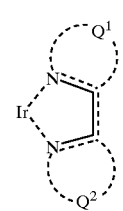

(1)

wherein $Q^1$ and $Q^2$ each represent an atomic group for completing a nitrogen-containing hetero ring, and $Q^1$ and $Q^2$ may be combined to form a condensed ring.

9 Claims, No Drawings

LIGHT EMITTING DEVICE MATERIAL COMPRISING IRIDIUM COMPLEX AND LIGHT EMITTING DEVICE USING SAME MATERIAL

FIELD OF THE INVENTION

The present invention relates to a material used for light emitting devices capable of light-emitting through conversion of electric energy into light, and a light emitting device using such a material. In particular, the invention is concerned with a light emitting device suitably used in various areas of indicators, displays, backlight, electrophotography, illumination sources, recording light sources, exposure illuminants, reading light sources, beacons, signboards, interiors and optical communication device.

BACKGROUND OF THE INVENTION

Recently animated researches and developments on various display devices have been made. Of such devices, the organic electroluminescence (EL) devices are receiving particular attention as promising display devices nowadays, because they can emit light of high intensity under low voltage. For instance, the EL devices having organic thin films formed by vapor deposition of organic compounds are known (*Applied Physics Letters*, 51, p.913 (1987)). The organic EL devices described in the literature cited above employ tris(8-hydroxyquinolinato)aluminum complex (Alq) as an electron transporting material, and they are each structured so to superimpose a layer of positive hole transporting material (an amine compound) on the layer of electron transporting material. By taking such a double-layer structure, those devices have substantial improvements in their light emitting characteristics over conventional single-layer devices.

In recent years, the application of organic EL devices to full-color displays has been examined actively. For development of high-performance color displays, it is necessary to improve characteristics of blue, green and red light emitting devices respectively.

As a means of improving characteristics of light emitting devices, the green light emitting device utilizing the luminescence from tris-ortho-metalated complex of iridium(III) with 2-phenylpyridine (Ir(ppy)$_3$) is proposed in *Applied Physics Letters*, 75, 4 (1999). Such a device has an external quantum yield coming up to 8%, and it surpasses hitherto known devices in external quantum yield because the external quantum yields of conventional devices are supposed to have the limit of 5%. However, that device confines its luminescence to green color, so its applicability as display is limited. Such being the case, development of light emitting device materials capable of light-emitting the other colors with high efficiency has been required.

On the other hand, the organic light emitting devices that have achieved luminescence of high luminance are devices comprising organic materials laminated by vacuum evaporation. In manufacturing devices, the use of coating methods have advantages over that of vacuum evaporation methods from the viewpoints of simplicity of the manufacturing process, workability and ease in achievement of large-area luminescence. However, the devices manufactured according to conventional coating methods are inferior to those manufactured using vapor deposition methods in luminous efficiency (light emitting efficiency). Therefore, the development of novel light emitting materials has been awaited.

SUMMARY OF THE INVENTION

It is an object of the invention to provide a light emitting device having excellent luminous characteristics and a material enabling a light emitting device to have such characteristics.

This object is attained with the following Embodiments (1) to (3) of the invention.

(1) A light emitting device material comprising an iridium complex having a partial structure represented by the following formula (1) or a tautomer thereof:

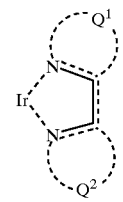

(1)

wherein $Q^1$ and $Q^2$ each independently represent an atomic group for completing a nitrogen-containing hetero ring, and $Q^1$ and $Q^2$ may be combined to form a condensed ring.

(2) A light emitting device comprising a pair of electrodes between which a light emitting layer or at least two thin layers of organic compounds, inclusive of a light emitting layer, are sandwiched, wherein at least one layer is a layer containing at least one light emitting device material as described in Embodiment (1).

(3) A light emitting device as described in Embodiment (2), wherein the layer containing at least one light emitting device material as described in Embodiment (1) is a layer formed by a coating process.

DETAILED DESCRIPTION OF THE INVENTION

The present invention is described below in detail.

First $Q^1$ and $Q^2$ in formula (1) are illustrated. $Q^1$ and $Q^2$ each represent an atomic group for completing a nitrogen-containing hetero ring. $Q^1$ and $Q^2$ may further be combined to form a condensed ring (e.g., a phenanthroline ring). Examples of a nitrogen-containing hetero ring completed by $Q^1$ and $Q^2$ each include a pyridine ring, a pyrazine ring, a pyrimidine ring, a quinoline ring, a quinoxaline ring, a naphthyridine ring, a quinazoline ring, a cinnoline ring, a pteridine ring, phenanthridine ring, benzazole rings (e.g., benzoxazole, benzothiazole, benzimidazole), a pyrazole ring, an imidazole ring, a triazole ring, a thiazole ring, an oxazole ring, an oxadiazole ring and a thiadiazole ring. These rings each may have a substituent group.

Examples of a substituent group which may be present on $Q^1$ and $Q^2$ each include alkyl groups (containing preferably 1 to 30 carbon atoms, more preferably 1 to 20 carbon atoms, particularly preferably 1 to 10 carbon atoms, such as methyl, ethyl, iso-propyl, tert-butyl, n-octyl, n-decyl, n-hexadecyl, cyclopropyl and cyclopentyl groups), alkenyl groups (containing preferably 2 to 30 carbon atoms, more preferably 2 to 20 carbon atoms, particularly preferably 2 to 10 carbon atoms, such as vinyl, allyl, 2-butenyl and 3-pentenyl groups), alkynyl groups (containing preferably 2 to 30 carbon atoms, more preferably 2 to 20 carbon atoms, particularly preferably 2 to 10 carbon atoms, such as propargyl and 3-pentynyl groups), aryl groups (containing preferably 6 to 30 carbon atoms, more preferably 6 to 20 carbon atoms, particularly preferably 6 to 12 carbon atoms, such as phenyl, p-methylphenyl, naphthyl and anthranyl groups), amino groups (containing preferably 0 to 30 carbon atoms, more preferably 0 to 20 carbon atoms, particularly preferably 0 to 10 carbon atoms, such as amino, methylamino, dimethylamino, diethylamino, dibenzylamino, diphenylamino and ditolylamino groups), alkoxy groups (containing preferably 1 to 30 carbon atoms, more preferably 1 to 20 carbon atoms, particularly preferably 1 to 10 carbon atoms, such as methoxy, ethoxy, butoxy and 2-ethylhexyloxy groups), aryloxy groups (containing preferably 6 to 30 carbon atoms, more preferably 6 to 20 carbon atoms, particularly preferably 6 to 12 carbon atoms, such as phenyloxy, 1-naphthyloxy and 2-naphthyloxy groups), heteroaryloxy groups (containing preferably 1 to 30 carbon atoms, more preferably 1 to 20 carbon atoms, particularly preferably 1 to 12 carbon atoms, such as pyridyloxy, prazyloxy, pyrimidyloxy and quinolyloxy groups), acyl groups (containing preferably 1 to 30 carbon atoms, more preferably 1 to 20 carbon atoms, particularly preferablty 1 to 12 carbon atoms, such as acetyl, benzoyl, formyl and pivaroyl groups), alkoxycarbonyl groups (containing preferably 2 to 30 carbon atoms, more preferably 2 to 20 carbon atoms, particularly preferably 2 to 12 carbon atoms, such as methoxycarbonyl and ethoxycarbonyl groups), aryloxycarbonyl groups (containing preferably 7 to 30 carbon atoms, more preferably 7 to 20 carbon atoms, particularly preferably 7 to 12 carbon atoms, such as a phenyloxycarbonyl group), acyloxy groups (containing preferably 2 to 30 carbon atoms, more preferably 2 to 20 carbon atoms, particularly preferably 2 to 10 carbon atoms, such as acetoxy and benzoyloxy groups), acylamino groups (containing preferably 2 to 30 carbon atoms, more preferably 2 to 20 carbon atoms, particularly preferably 2 to 10 carbon atoms, such as acetylamino and benzoylamino groups), alkoxycarbonylamino groups (containing preferably 2 to 30 carbon atoms, more preferably 2 to 20 carbon atoms, particularly preferably 2 to 12 carbon atoms, such as a methoxycarbonylamino group), aryloxycarbonylamino groups (containing preferably 7 to 30 carbon atoms, more preferably 7 to 20 carbon atoms, particularly preferably 7 to 12 carbon atoms, such as a phenyloxycarbonylamino group), sulfonylamino groups (containing preferably 1 to 30 carbon atoms, more preferably 1 to 20 carbon atoms, particularly preferably 1 to 12 carbon atoms, such as methanesulfonylamino and benzenesulfonylamino groups), sulfamoyl groups (containing preferably 0 to 30 carbon atoms, more preferably 0 to 20 carbon atoms, particularly preferably 0 to 12 carbon atoms, such as sulfamoyl, methylsulfamoyl, dimethylsulfamoyl and phenylsulfamoyl groups), carbamoyl groups (containing preferably 1 to 30 carbon atoms, more preferably 1 to 20 carbon atoms, particularly preferably 1 to 12 carbon atoms, such as carbamoyl, methylcarbamoyl, diethylcarbamoyl and phenylcarbamoyl groups), alkylthio groups (containing preferably 1 to 30 carbon atoms, more preferably 1 to 20 carbon atoms, particularly preferably 1 to 12 carbon atoms, such as methylthio and ethylthio groups), arylthio groups (containing preferably 6 to 30 carbon atoms, more preferably 6 to 20 carbon atoms, particularly preferably 6 to 12 carbon atoms, such as a phenylthio group), heteroarylthio groups (containing preferably 1 to 30 carbon atoms, more preferably 1 to 20 carbon atoms, particularly preferably 1 to 12 carbon atoms, such as pyridylthio, 2-benzimidazolylthio, 2-benzoxazolylthio and 2-benzothiazolylthio groups), sulfonyl groups (containing preferably 1 to 30 carbon atoms, more preferably 1 to 20 carbon atoms, particularly preferably 1 to 12 carbon atoms, such as mesyl and tosyl groups), sulfinyl groups (containing preferably 1 to 30 carbon atoms, more preferably 1 to 20 carbon atoms, particularly preferably 1 to 12 carbon atoms, such as methanesulfinyl and benzenesulfinyl groups), ureido groups (containing preferably 1 to 30 carbon atoms, more preferably 1 to 20 carbon atoms, particularly preferably 1 to 12 carbon atoms, such as ureido, methylureido and phenylureido groups), phosphoric acid amido groups (containing preferably 1 to 30 carbon atoms, more preferably 1 to 20 carbon atoms, particularly preferably 1 to 12 carbon atoms, such as diethylphosphoric acid amido and phenylphosphoric acid amido groups) a hydroxyl group, a mercapto group, halogen atoms (e.g., fluorine, chlorine, bromide, iodine), a cyano group, a sulfo group, a carbonyl group, a nitro group, a hydroxamic acid group, a sulfino group, a hydrozino group, an imino group, heterocyclic groups (containing preferably 1 to 30 carbon atoms, more preferably 1 to 12 carbon atoms, and nitrogen, oxygen or/and sulfur atoms as hetero atom(s), such as imidazolyl, pyridyl, quinolyl, furyl, thienyl, piperidyl, morpholino, benzoxazolyl, benzimidazolyl and benzothiazolyl groups), and silyl groups (containing preferably 3 to 40 carbon atoms, more preferably 3 to 30 carbon atoms, particularly preferably 3 to 24 carbon atoms, such as trimethylsilyl and triphenylsilyl groups). These substituent groups may further be substituted, and some pairs of them may be combined between themselves to form ring structures.

Of the nitrogen-containing hetero rings recited above as those completed by $Q^1$ and $Q^2$ respectively, pyridine, pyrazine, pyrimidine, quinoline, benzazole and imidazole rings are preferred over the others.

The present compound (an iridium complex having a partial structure represented by formula (1) or a tautomer thereof) has no particular restrictions on the valence number of iridium. However, the iridium atom present therein is preferably in a trivalent state. The present compound may contain one iridium atom, or it may be the so-called polynuclear complex wherein two or more iridium atoms are present. Further, the present compound may contain other metal atoms in addition to iridium atom.

The present compound can have various ligands. As examples of ligands the present compound can have, mention may be made of the ligands described, e.g., in H. Yersin, *Photochemistry and Photophysics of Coordination Compounds*, Springer-Verlag A. G. (1987), and Akio Yamamoto, *Yuki Kinzoku Kagaku -Kiso to Oyo-* (which means "Organometallic Chemistry -Fundamentals and Applications-"), Shokabo Co. (1982). Of those ligands, halo ligands (e.g., chloro), nitrogen-containing hetero ring ligands (e.g., phenylpyridine, benzoquinoline, quinolinolato), diketoneligands, carboxylato ligands and $PF_6$ ligand are preferred over the others. In particular, chloro, phenylpyridine, diketone and $PF_6$ ligands can be advantageously introduced into the compounds according to the invention.

The ligands introduced into the present compound may be the same or different in kind. Specifically, one to three kinds of ligands, preferably one or two kinds of ligands, may be present in the present complex.

The suitable number of carbon atoms contained in the present compound is from 5 to 100, preferably from 10 to 50, particularly preferably from 14 to 30.

It is suitable for the present compound to have the form of a compound represented by the following formula (2) or the form of a compound containing an ion represented by the following formula (2):

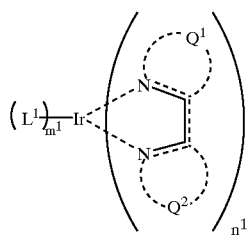

(2)

wherein $Q^3$ and $Q^4$ have the same meanings as $Q^1$ and $Q^2$ in formula (1), respectively; $L^1$ represents a ligand (with examples including the ligands recited above as those which may constitute the iridium complex having the partial structure represented by formula (1) or a tautomer thereof, and the preferred scope of which is the same as mentioned above); $m^1$ represents an integer of 0 to 6, preferably 0 to 3, and when $m^1$ is 2 or more the $L^1$ ligands may be the same or different; and $n^1$ represents an integer of 0 to 4, preferably 1 to 3, particularly preferably 3, and when $n^1$ is 2 or more the ligands containing both $Q^3$ and $Q^4$ moieties may be the same or different.

The compound having an ion represented by formula (2) is illustrated below. Such a compound is constituted of an ion represented by formula (2) and a counter ion required for neutralizing the charge on the ion. The counter ion is not limited to particular species, but it may be any of the counter ions described, e.g., in the book cited above, Akio Yamamoto, *Yuki Kinzoku Kagaku -Kiso to Oyo-* (which means "Organometallic Chemistry-Fundamentals and Applications-"), Shokabo Co., Ltd. (1982). Examples of a counter ion suitable for the present compound include halide ions (e.g., fluoride, chloride, bromide, iodide), cyanide ion, alkali metal ions, alkaline earth metal ions, ammonium ion and $PF_6$ ion. Of these ions, chloride ion and $PF_6$ ion are preferred over the others.

When the partial structure represented by formula (1) is regarded as one repeating unit, the present compound may be the so-called low molecular compound in which only one repeating unit is contained, or an oligomer or polymer compound in which a plurality of repeating units are contained. Additionally, the suitable weight average molecular weight of such an oligomer or polymer is from 1,000 to 5,000,000, preferably from 2,000 to 1,000,000, particularly preferably from 3,000 to 100,000, on a polystyrene basis. However, it is preferable that the present compound is a low molecular compound.

Examples of compounds according to the invention are illustrated below, but it should be understood that these examples are not to be construed as limiting the scope of the invention in any way.

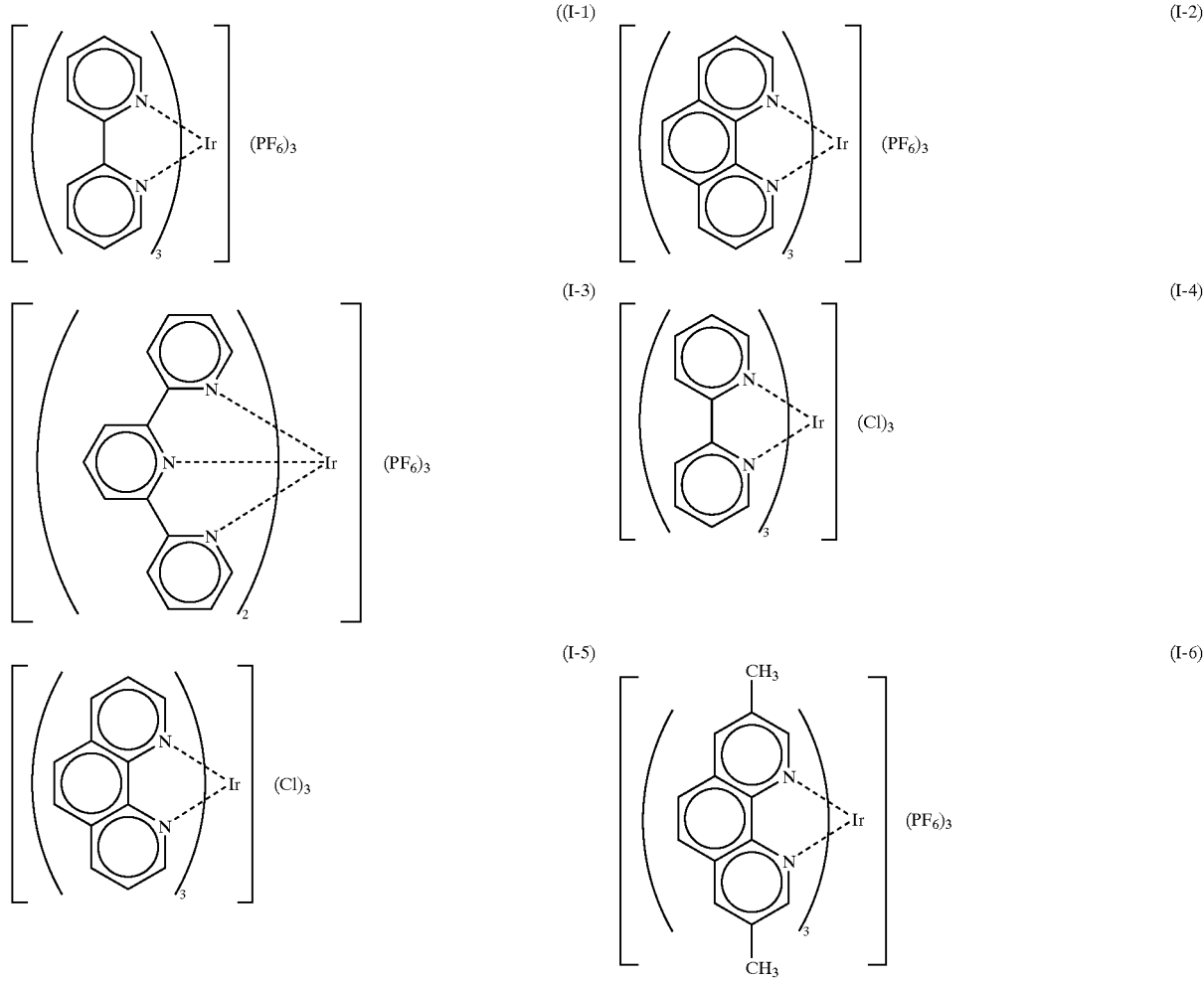

-continued
(I-7)
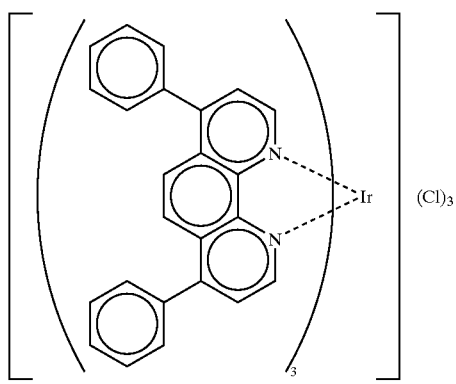
(I-8)
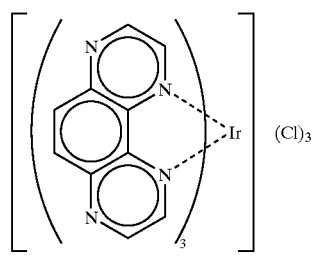
(I-9)
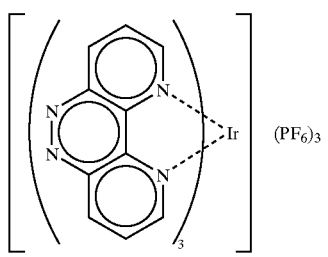
(I-10)
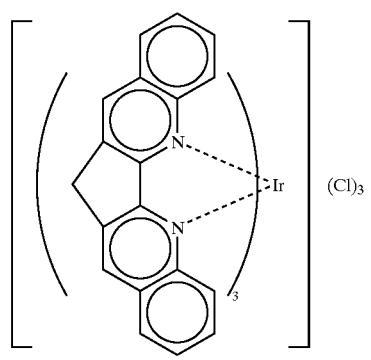
(I-11)
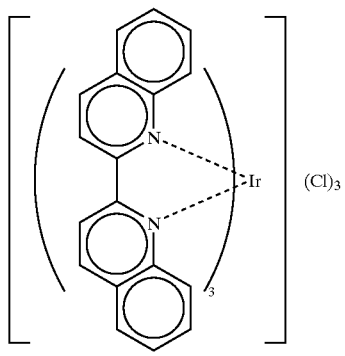
(I-12)
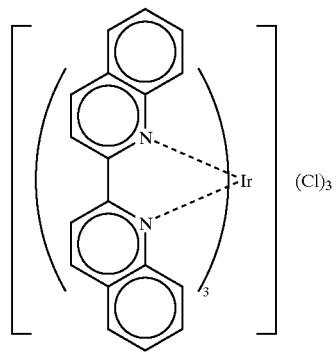
(I-13)
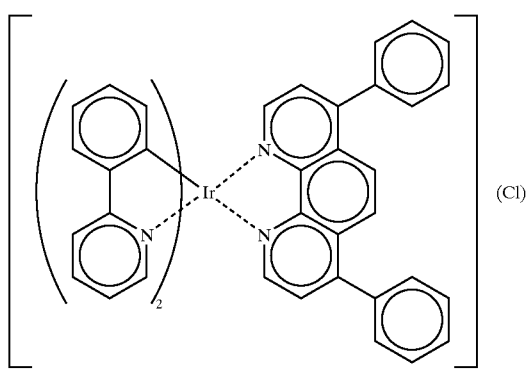
(I-14)
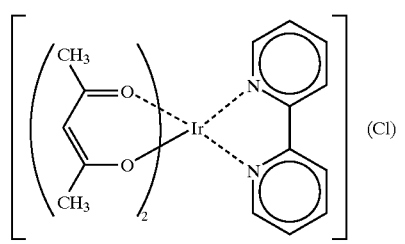

-continued
(I-15)
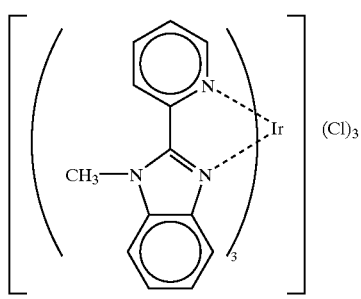
(I-16)
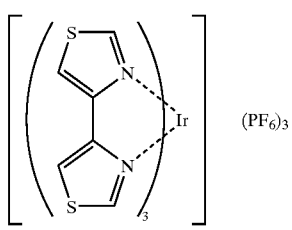
(I-17)
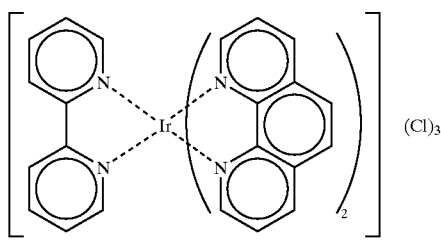
(I-18)
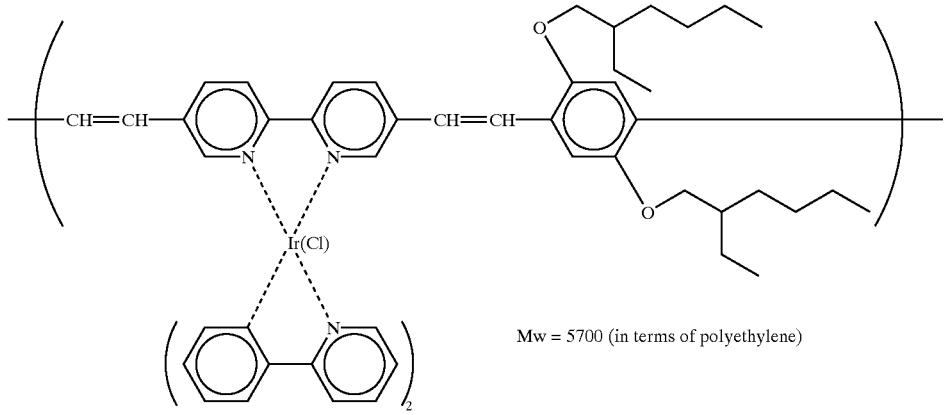
Mw = 5700 (in terms of polyethylene)
(I-19)
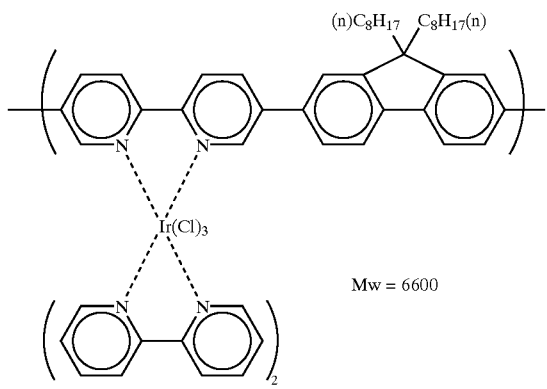
Mw = 6600
(I-20)
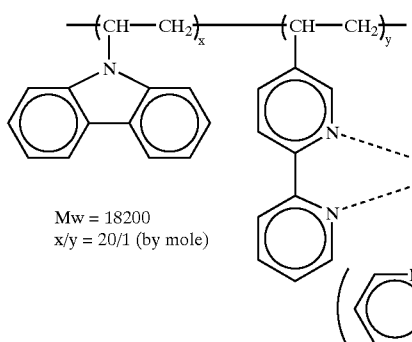
Mw = 18200
x/y = 20/1 (by mole)
(I-21)
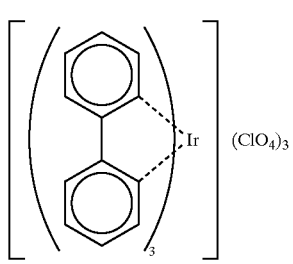
(I-22)
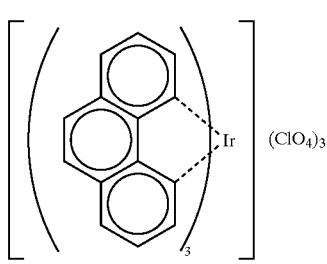

-continued
(I-23)
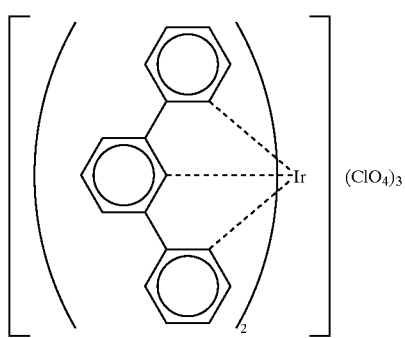
(I-24)
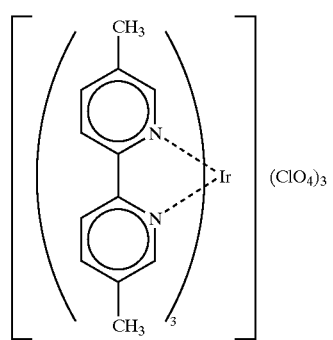
(I-25)
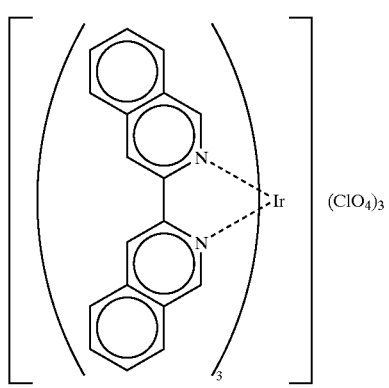
(I-26)
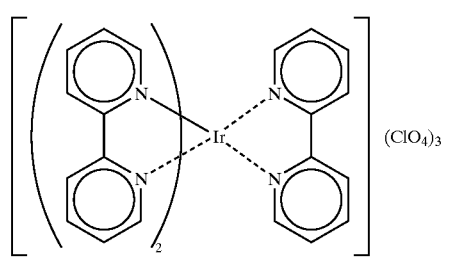
(I-27)
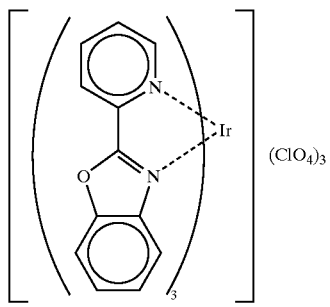
(I-28)
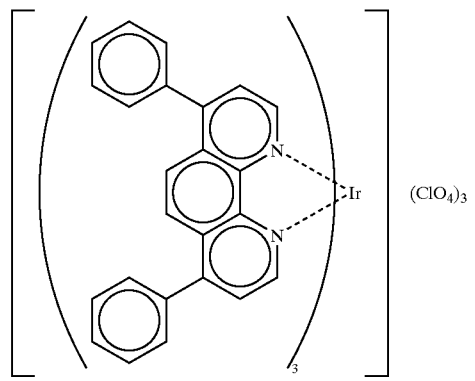
(I-29)
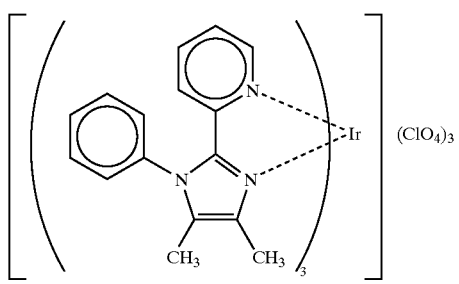
(I-30)
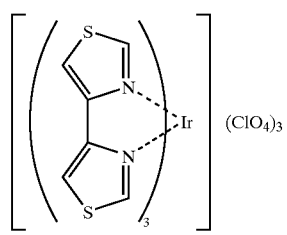

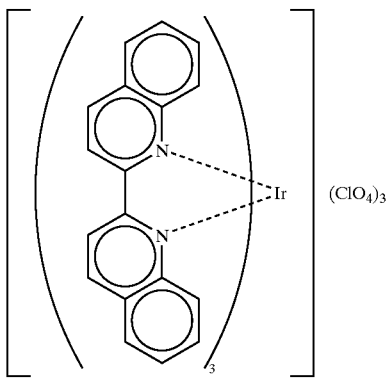

(I-31)

An example of compounds according to the invention is described, e.g., in *Pure Appl. Chem.*, 52, 2717 (1980), and these compounds can be synthesized using various known methods.

Specifically, the present compounds each can be synthesized by the interaction of ligands (including dipyridyl derivatives) or dissociates thereof and a transition metal compound (e.g., $K_3IrCl_6$, trisacetylacetonatoiridium complex) in the presence or absence of a solvent (e.g., a halogen-containing solvent, an alcoholic solvent, an ethereal solvent), in the presence or absence of a base (with examples including various inorganic and organic bases, such as sodium methoxide, potassium t-butoxide, triethylamine and potassium carbonate) at room temperature or below or under heating (for which microwave irradiation can be used effectively as well as ordinary heating means).

A synthesis example of the present Compound (I-4) is shown below.
Synthesis of Compound (I-4):

$K_3IrCl_6$ and 2,2'-bipyridyl in amounts of 0.5 g and 0.75 g respectively were heated for 8 hours in a mixed solvent constituted of 20 ml of 2-methoxyethanol and 5 ml of water, thereby depositing orange crystals. The crystals were filtered off to give 0.3 g of Compound (I-4).

Next, light emitting devices containing compounds according to the invention are illustrated below. As far as the present light emitting devices utilize compounds according to the invention, what system, operation method and utilization mode are used for them don't constitute matters of particular concern. However, the devices utilizing luminescence from the present compounds and the devices utilizing the present compounds as electron transport materials are preferred as the present devices. The representatives of light emitting devices are organic EL (electroluminescence) devices.

The organic layers of the light emitting devices containing the present compounds are not particularly restricted in their formation methods, but they can be formed using, e.g., a resistance heating vapor deposition method, an electron beam method, a sputtering method, a molecular lamination method, a coating method, an ink-jet method, a printing method or a transfer method. Of these methods, the resistance heating vapor deposition method and the coating method are preferred over the others in the characteristic and productive aspects.

Every light emitting device according to the invention is a device comprising a pair of electrodes, namely an anode and a cathode, between which a light emitting layer or at least two thin layers of organic compounds, inclusive of a light emitting layer, are sandwiched. The thin layers the device may have in addition to the light emitting layer are, e.g., a hole injection layer, a hole transport layer, an electron injection layer, an electron transport layer and a protective layer. Each of these layers may have another function. For forming each layer, various materials can be employed.

The anode supplies holes to a hole injection layer, a hole transport layer and a light emitting layer, and can be made of a metal, an alloy, a metal oxide, an electrically conductive material or a mixture of two or more thereof, preferably a material having a work function of at least 4 eV. Examples of such a material include conductive metal oxides, such as tin oxide, zinc oxide, indium oxide and indium tin oxide (ITO), metals such as gold, silver, chromium and nickel, mixtures or laminates of those metals and conductive metal oxides, inorganic conductive materials such as copper iodide and copper sulfide, organic conductive materials such as polyaniline, polylthiophene and polypyrrole, and laminates of those materials and ITO. Of the materials recited above, the conductive metal oxides, especially ITO, are advantageous over the others from the viewpoints of productivity, high conductivity and transparency. The suitable thickness of the anode, though can be selected depending on the anode material, is generally from 10 nm to 5 $\mu$m, preferably 50 nm to 1 $\mu$m, particularly preferably 100 nm to 500 nm.

In general the anode is used in the state of a layer formed on a soda lime glass, alkali-free glass or transparent resin substrate. In the case of using a glass substrate, alkali-free glass is preferred from the viewpoint of reduction in ions eluted from the glass. When soda lime glass is used as the substrate, it is favorable that the glass be provided with a barrier coating, such as a silica coating. The substrate thickness has no particular limitation so long as the substrate can ensure mechanical strength for the anode. For instance, the suitable thickness of a glass substrate is at least 0.2 mm, preferably at least 0.7 mm.

The methods suitable for making the anode vary with the material used. In the case of ITO, for instance, the film formation can be carried out using an electron beam method, a sputtering method, a resistance heating vapor deposition method, a chemical reaction method (e.g., sol-gel method) or the method of coating a dispersion of indium tin oxide.

By receiving washing and other treatments after film formation, the anode can yield in the device a reduction of operation potential and elevation of light-emitting efficiency. In the case of an anode using ITO, it is effective for the anode to receive UV-ozone treatment or plasma treatment.

The cathode supplies electrons to an electron injection layer, an electron transport layer and a light emitting layer.

In selecting the cathode, the adhesion to the electron injection, electron transport or light emitting layer adjacent to the cathode, the ionization potential and the stability are taken into consideration. As cathode materials, metals, alloys, metal halides, metal oxides, electrically conductive materials and mixtures of two or more thereof can be employed. Examples of such materials include alkali metals (e.g., Li, Na, K) and the fluorides or oxides thereof, alkaline earth metals (e.g., Mg, Ca) and the fluorides or oxides thereof, gold, silver, lead, aluminum, Na—K alloy or mixtures of two or more of these metals, Li—Al alloy or mixture, Mg—Ag alloy or mixture, and rare earth metals (e.g., In, Yb). Of these materials, the materials having a work function of at most 4 eV are preferred over the others. In particular, aluminum, Li—Al alloy or mixture, and Mg—Ag alloy or mixture are used to advantage. The cathode may have a single-layer structure comprising a compound or mixture as recited above or a lamination structure comprising compounds or/and mixtures as recited above. For instance, the appropriate layer structure of the cathode is an Al—LiF laminated structure or an Al—$Li_2O$ laminated structure. The suitable thickness of the cathode, though can be chosen depending on the cathode material, is generally from 10 nm to 5 $\mu$m, preferably 50 nm to 1 $\mu$m, particularly preferably 100 nm to 1 $\mu$m.

In forming the cathode, various known methods, such as an electron beam method, a sputtering method, a resistance heating vapor deposition method and a coating method, can be adopted. The metals as recited above may be evaporated independently, or two or more thereof may be evaporated simultaneously. Further, it is possible to evaporate a plurality of metals at the same time to form an alloy electrode. Also, the previously prepared alloy may be subjected to vapor deposition.

It is advantageous to the light emitting device that both anode and cathode have low sheet resistance, specifically several hundreds $\Omega/\square$ at the highest.

For a light emitting layer, any materials can be used so far as they can form a layer having the following functions. One function is to receive hole injection from the anode, the hole injection layer or the hole transport layer as well as electron injection from the cathode, the electron injection layer or the electron transport layer when the electric field is applied to the light emitting device. Another function is to permit the charges injected in the layer to move. The other function is to enable the emission of light by providing a place for recombining holes and electrons. Further, the materials used for the light emitting layer may be either materials enabling luminescence from singlet-state excitons or materials enabling luminescence from triplet-state excitons. Examples of such materials include benzoxazole, benzimidazole, benzothiazole, styrylbenzene, polyphenyl, diphenylbutadiene, tetraphenylbutadiene, naphthalimide, coumarin, perylene, perinone, oxadiazole, aldazine, pyraridine, cyclopentadiene, bisstyrylanthracene, quinacridone, pyrrolopyridine, thiadiazolopyridine, styrylamine, aromatic dimethylidyne compounds, various metal complexes represented by metal or rare earth complexes of 8-quinolinol, polymeric compounds such as polythiophene, polyphenylene and polyphenylenevinylene, organic silane compounds, derivatives of the compounds recited above, and the present compounds. Although the light emitting layer has no particular restrictions as to the thickness, the suitable thickness thereof is generally from 1 nm to 5 $\mu$m, preferably 5 nm to 1 $\mu$m, particularly preferably 10 nm to 500 nm.

As to the method of forming the light emitting layer, there is no particular restriction, but various methods can be adopted. Examples of methods usable herein include a resistance heating vapor deposition method, an electron beam method, a sputtering method, a molecular lamination method, a coating method (e.g., a spin coating, cast coating or dip coating method), an ink-jet method, a printing method, an LB method and a transfer method can be adopted. Of these methods, a resistance heating vapor deposition method and a coating method are preferred over the others.

The materials for a hole injection layer and a hole transport layer may be any materials so long as they have any one of the functions as an injector of holes from the anode, a transporter of holes and a barrier against electrons injected from the cathode. Examples of a material having one of such functions include carbazole, triazole, oxazole, oxadiazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidyne compounds, porphyrin compounds, polysilane compounds, conductive polymers and oligomers such as poly(N-vinylcarbazole), aniline copolymers, thiophene oligomers and polythiophene, organic silane compounds, derivatives of the compounds recited above, carbon film and the present compounds. The suitable thickness of the hole injection layer and the hole transport layer each, though it has no particular limitation, is generally from 1 nm to 5 $\mu$m, preferably 5 nm to 1 $\mu$m, particularly preferably 10 nm to 500 nm. Each of the hole injection layer and the hole transport layer may have a single-layer structure constituted of one or more of the materials recited above or a multiple-layer structure made up of at least two layers having the same composition or different compositions.

As a method of forming the hole injection layer and the hole transport layer, a vacuum evaporation method, an LB method, a method of coating solutions or dispersions of hole-injecting and transporting agents (by the use of, e.g., a spin coating, cast coating or dip coating method), an ink-jet method, a printing method and a transfer method can be adopted. When the coating method is adopted, the materials to constitute the layer the layers may be dissolved or dispersed in a coating solvent, together with a resinous ingredient. Examples of such a resinous ingredient include polyvinyl chloride, polycarbonate, polystyrene, polymethyl methacrylate, polybutylmethacrylate, polyester, polysulfone, polyphenylene oxide, polybutadiene, poly(N-vinylcarbazole), hydrocarbon resin, ketone resin, phenoxyresin, polyamide, ethyl cellulose, polyvinyl acetate, ABS resin, polyurethane, melamine resin, unsaturated polyester resin, alkyd resin, epoxy resin and silicone resin.

The materials for the electron injection layer and the electron transport layer may be any materials so long as they have any one of the functions as an injector of electrons from the cathode, a transporter of the electrons and a barrier against holes injected from the anode. Examples of a material having one of such functions include triazole, oxazole, oxadiazole, imidazole, fluorenone, anthraquinodimethane, anthrone, diphenylquinone, thiopyran dioxide, carbodimide, fluorenylidenemethane, distyrylpyrazine, tetracarboxylic acid anhydrides of aromatic condensed rings such as naphthalene and perylene, phthalocyanine, various metal complexes represented by metal complexes of 8-quinolinol, metallophthalocyanines and metal complexes having benzoxazole or benzothiazole ligands, organic silane compounds, derivatives of the compounds recited above, and the present compounds. The suitable thickness of the electron injection layer and the electron transport layer each, though it has no particular limitation, is generally from 1 nm to 5 μm, preferably 5 nm to 1 μm, particularly preferably 10 nm to 500 nm. Each of the electron injection layer and the electron transport layer may have a single-layer structure constituted of one or more of the materials as recited above, or a multiple-layer structure made up of at least two layers having the same composition or different compositions.

As a method of forming the electron injection layer and the electron transport layer, a vacuum evaporation method, an LB method, a method of coating solutions or dispersions of electron-injecting and transporting agents as recited above (by the use of, e.g., a spin coating, cast coating or dip coating method), an ink-jet method, a printing method and a transfer method can be adopted. In the case of adopting a coating method, the electron-injecting and transporting agents can be dissolved or dispersed together with a resinous ingredient. Examples of a resinous ingredient usable therein include the same resins as employed for the hole injection and transport layers.

The materials for a protective layer may be any compounds so long as they can function as an agent of inhibiting deterioration promoters, such as moisture and oxygen, from invading into the device. Examples of such a compound include metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $AlF_3$ and $CaF_2$, nitrides such as SiN and $SiN_xO_y$, polyethylene, polypropylene, polymethyl methacrylate, polyimide, polyurea, polytetra-fluoroethylene, polychlorotrifluoroethylene, polydichloro-difluoroethylene, copolymer of chlorotrifluoroethylene and dichlorodifluoroethylene, a copolymer prepared by polymerizing a mixture of tetrafluoroethylene and at least one comonomer, and a fluorine-containing copolymer having cyclic structures in the main chain, a water-absorbing substance having a water absorption rate of at least 1%, and a moisture-proof substance having a water absorption rate of at most 0.1%.

The protective layer also has no particular restriction as to the formation method, but any of a vacuum evaporation method, a sputtering method, a reactive sputtering method, a molecular beam epitaxy (MBE) method, a cluster ion beam method, an ion plating method, a plasma polymerization method (high frequency excitation ion plating method), a plasma chemical vapor deposition (CVD) method, a laser CVD method, a heat CVD method, a gas source CVD method, a coating method, a printing method and a transfer method can be adopted for the formation thereof.

The present invention will now be illustrated in more detail by reference to the following examples. However, the invention should not be construed as being limited to these examples.

COMPARATIVE EXAMPLE 1

Poly(N-vinylcarbazole) in an amount of 40 mg, 12 mg of PBD [2-(4-biphenyl)-5-(4--t-butylphenyl)-1,3,4-oxadiazole] and 1 mg of compound (A) were dissolved in 2.5 ml of dichloroethane, and spin-coated on a cleaned substrate (1,500 r.p.m., 10 sec). The thickness of the thus formed organic layer was 98 nm. A patterned mask (for adjusting each emission area to 4 mm×5 mm) was put on the thin organic layer, and installed in a vacuum evaporation apparatus. By the use of this apparatus, Mg and Ag were deposited simultaneously on the thin organic layer via the patterned mask in a Mg/Ag ratio of 10/1, thereby forming a metallic film having a thickness of 50 nm, followed by deposition of a 50 nm-thick Ag film. The thus produced EL device was made to luminesce by applying thereto a DC constant voltage by means of a source measure unit, Model 2400, made by Toyo Technica Co., Ltd., and examined for luminance and wavelengths of luminescence by using a luminometer BM-8 made by Topcon Co. and a spectrum analyzer PMA-11 made by Hamamatsu Photonics Co. respectively. As a result, it was found that the luminescence was bluish green, the wavelength at which the luminescence had the maximal luminance (ELmax) was 510 nm, and the luminescence initiating voltage was 11 V.

Compound (A)

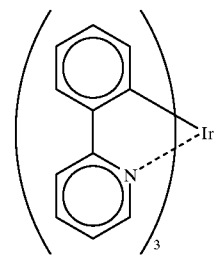

EXAMPLE 1

An EL device was produced in the same manner as in Comparative Example 1, except that Compound (I-1) was used in place of Compound (A) This device provided a luminescence showing ELmax at 530 nm, and the luminescence initiating voltage thereof was 9 V.

EXAMPLE 2

An EL device was produced in the same manner as in Comparative Example 1, except that Compound (I-2) was used in place of Compound (A). This device provided a luminescence showing ELmax at 530 nm, and the luminescence initiating voltage thereof was 9 V.

EXAMPLE 3

An EL device was produced in the same manner as in Comparative Example 1, except that Compound (I-3) was used in place of Compound (A). This device provided a luminescence showing ELmax at 570 nm, and the luminescence initiating voltage thereof was 10 V.

EXAMPLE 4

An EL device was produced in the same manner as in Comparative Example 1, except that Compound (I-12) was used in place of Compound (A). This device provided a luminescence showing ELmax at 630 nm, and the luminescence initiating voltage thereof was 9 V.

EXAMPLE 5

An EL device was produced in the same manner as in Comparative Example 1, except that Compound (I-21) was used in place of Compound (A). This device provided a luminescence showing ELmax at 530 nm, and the luminescence initiating voltage thereof was 8 V.

Similarly to the above, EL devices containing the other compounds according to the invention were produced, and light emitting characteristics thereof were evaluated. By doing so, it was confirmed that the present compounds enabled the production of EL devices having various light emitting colors and lowering of operation voltage.

The compounds according to the invention can be used as materials for organic light emitting devices. The light emitting devices using the present compounds can be various in their light emitting colors, and can have reduced operation voltages.

What is claimed is:

1. A light emitting device comprising:

a pair of electrodes; and one of a light emitting layer and at least two thin layers of organic compounds comprising a light emitting layer, between the electrodes, wherein at least one layer is a layer comprising at least one light emitting device material, the light emitting device material comprising an iridium complex having a partial structure represented by the following formula (1) or a tautomer thereof:

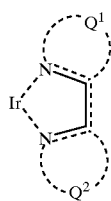

(1)

wherein $Q^1$ and $Q^2$ each independently represent an atomic group for completing a nitrogen-containing hetero ring, and $Q^1$ and $Q^2$ may be combined to form a condensed ring.

2. The light emitting device as described in claim 1, wherein the layer comprising at least one light emitting device material is a layer formed by a coating process.

3. The light emitting device according to claim 1, wherein the iridium complex is a compound represented by the following formula (2) or a compound having an ion represented by the following formula (2) and a counter ion required for neutralizing the charge on the ion:

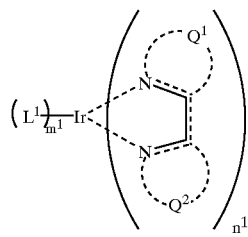

(2)

wherein $Q^3$ and $Q^4$ have the same meanings as $Q^1$ and $Q^2$ in formula (1), respectively; $L^1$ represents a ligand; $m^1$ represents an integer of 0 to 4, and when $m^1$ is 2 or more, the $L^1$ ligands are the same or different; and $n^1$ represents an integer of 1 to 3, and when $n^1$ is 2 or more, the ligands containing both $Q^3$ and $Q^4$ moieties are the same or different.

4. The light emitting device according to claim 3, wherein the $L^1$ ligand is a halo ligand, a nitrogen-containing hetero ring ligand, a diketone ligand, a carboxylate ligand or a $PF_6$ ligand.

5. The organic light emitting device of claim 3, wherein the counter ion is fluoride ion, chloride ion, bromide ion, iodide ion, cyanide ion, alkali metal ions, alkaline earth metal ions, ammonium ion, $ClO_4$ ion or $PF_6$ ion.

6. The organic light emitting device of claim 3, wherein $n^1$ is 3 and $m^1$ is 0.

7. The organic light emitting device of claim 3, wherein the counter ion is fluoride ion, chloride ion, bromide ion, iodide ion, cyanide ion, alkali metal ions, alkaline earth metal ions, ammonium ion, $ClO_4$ ion or $PF_6$ ion and wherein $n^1$ is 3 and $m^1$ is 0.

8. The light emitting device according to claim 1, wherein the nitrogen-containing hetero group completed by $Q^1$ and $Q^2$ is a pyridine ring, a pyrazine ring, a pyrimidine ring, a quinoline ring, a quinoxaline ring, a naphthyridine ring, a quinazoline ring, a cinnoline ring, a pteridine ring, a phenanthridine ring, a benzazole ring, a pyrazole ring, an imidazole ring, a triazole ring, a thiazole ring, an oxazole ring, an oxadiazole ring or a thiadiazole ring.

9. The light emitting device according to claim 1, wherein the nitrogen-containing hetero group completed by $Q^1$ and $Q^2$ is a pyridine ring, a pyrazine ring, a pyrimidine ring, a quinoline ring, a benzazole ring or an imidazole ring.

* * * * *